United States Patent
Aigner

(10) Patent No.: US 8,186,028 B2
(45) Date of Patent: May 29, 2012

(54) METHOD OF MANUFACTURING A PIEZOELECTRIC RESONATOR HAVING IMPROVED TEMPERATURE COMPENSATION

(75) Inventor: Robert Aigner, Ocoes, FL (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 653 days.

(21) Appl. No.: 12/344,829

(22) Filed: Dec. 29, 2008

(65) Prior Publication Data
US 2009/0100657 A1     Apr. 23, 2009

Related U.S. Application Data

(62) Division of application No. 11/318,342, filed on Dec. 23, 2005, now Pat. No. 7,486,006.

(30) Foreign Application Priority Data

Dec. 23, 2004  (DE) .......................... 10 2004 062 312

(51) Int. Cl.
*H04R 17/10*       (2006.01)
*H05K 7/02*        (2006.01)
(52) U.S. Cl. ........................... 29/25.35; 29/846; 29/831
(58) Field of Classification Search ................ 29/25.35, 29/594, 846, 831; 310/313 B, 324, 346; 166/272.1
See application file for complete search history.

(56) References Cited

U.S. PATENT DOCUMENTS

| | | | |
|---|---|---|---|
| 4,456,850 A | | 6/1984 | Inoue et al. |
| 5,998,907 A | * | 12/1999 | Taguchi et al. ........... 310/313 R |
| 6,989,723 B2 | | 1/2006 | Komuro et al. |
| 2002/0038989 A1 | | 4/2002 | Larson, III |
| 2003/0079877 A1 | * | 5/2003 | Wellington et al. ........ 166/272.1 |
| 2004/0046622 A1 | | 3/2004 | Aigner et al. |
| 2004/0113720 A1 | | 6/2004 | Komuro et al. |
| 2005/0057117 A1 | | 3/2005 | Nakatsuka et al. |
| 2005/0110598 A1 | | 5/2005 | Larson |
| 2007/0120625 A1 | | 5/2007 | Larson et al. |

FOREIGN PATENT DOCUMENTS

| | | |
|---|---|---|
| CN | 1188779 | 7/1998 |
| CN | 1489196 | 4/2004 |
| JP | 1126939 | 5/1989 |
| JP | 10270978 A | * 10/1998 |

OTHER PUBLICATIONS

Machine Language Translation of JP 10-270978.*
Dubbois, Marc-Alexandre et al., "Properties of Aluminum Nitride Thin Films for Piezoelectric Transducers and Microwave Filter Applications", *Applied Physics Letters*, vol. 74, No. 20. American Institute of Physics, (May 1999).

* cited by examiner

*Primary Examiner* — A. Dexter Tugbang

(57) ABSTRACT

A method for manufacturing a piezoelectric resonator, comprising the step of: producing an arrangement comprising a piezoelectric layer having a resonance frequency temperature coefficient of a first sign, a first and a second electrode. The piezoelectric layer is arranged between the first and second electrodes, and a compensation layer is arranged between the first electrode and the piezoelectric layer. The compensation layer has a compensation material having a second resonance frequency temperature coefficient of a second sign opposite to the first one. The producing comprises providing the compensation material with a modification material to increase a conductivity of the compensation layer in a direction between the first electrode and the piezoelectric layer.

5 Claims, 7 Drawing Sheets

METHOD OF MANUFACTURING A PIEZOELECTRIC RESONATOR HAVING IMPROVED TEMPERATURE COMPENSATION

CROSS-REFERENCE TO RELATED APPLICATION

This application claims priority from German Patent Application No. 10 2004 062 312.0, which was filed on Dec. 23, 2004, and is incorporated herein by reference in its entirety.

The present application is divisional application under 37 C.F.R. §1.53(d) of U.S. patent application Ser. No. 11/318, 342 filed Dec. 23, 2005, Now U.S. Pat. No. 7,486,006, which is commonly owned. The present application claims priority under 35 U.S.C. §120 from U.S. Pat. No. 7,486,006, the disclosure of which is specifically incorporated herein by reference.

BACKGROUND OF THE INVENTION

1. Field of the Invention

The present invention relates to a piezoelectric resonator having temperature compensation and an improved electromechanical coupling coefficient, and to a method for manufacturing same.

2. Description of Prior Art

Piezoelectric resonators are being employed in electrical devices to an increasing extent. Piezoelectric resonators are, for example, suitable for being used in mobile telephones to filter out a frequency from a frequency spectrum. Apart from mobile telephones, all modules allowing wireless communication are generally typical applications of piezoelectric resonators. These modules are, for example, employed in laptop computers or PDAs to communicate wirelessly with a data network.

A piezoelectric resonator consists of at least two electrodes between which a piezoelectric layer is arranged. A special case of the piezoelectric resonator is the so-called BAW resonator (BAW=bulk acoustic wave) comprising high or low electrical impedance depending on a frequency of the alternating voltage applied. A BAW filter here functions like a switch which is closed when the frequency of the alternating voltage at the two electrodes is within a resonance frequency band and which is open when the frequency of the alternating voltage is not in the resonance frequency band.

The resonance frequency of the piezoelectric resonators and thus also of the bulk acoustic wave resonators depends on temperature. The temperature dependence of the resonance frequency is a decisive performance characteristic for piezoelectric resonators, because it determines in which range the resonance frequency of the piezoelectric resonator varies when operated. When operating the piezoelectric resonators, it must be kept in mind that the limits of the pass region of the piezoelectric resonator employed are selected such that the frequency to be filtered out is within the limits of the pass region over the entire temperature range. A reduction of the temperature dependence of the resonance frequency of the piezoelectric resonator allows manufacturing these filters with improved characteristics but also with an increased manufacturing yield. When testing the piezoelectric resonators only those elements where the resonance frequency is within limits predetermined by the manufacturer over the entire specified temperature range of the piezoelectric resonator are classified as being suitable for delivery.

This requirement to piezoelectric resonators may result in a deterioration in the pass band behavior or the manufacturing yield in production.

FIG. 7 shows a conventional piezoelectric resonator. Three conducting layers 3 and two insulating layers 5 are applied to a substrate 1 alternatingly. A first electrode 7a is arranged on the uppermost conducting layer 5. The first electrode 7a is covered by a first acoustic densification layer 9a onto which a piezoelectric layer 11 is deposited. The piezoelectric layer 11 in turn is covered by a second acoustic densification layer 9b on which there is the second electrode 7b.

When applying an alternating voltage between the first electrode 7a and the second electrode 7b, a mechanical wave forms in the multi-layered setup. At a resonance frequency, there is a current in the electrodes 7a, 7b. The resonance frequency of the piezoelectric resonator shown here depends on a form and dimensions of the multi-layered setup, ambient temperature and the materials used in the multi-layered setup.

It is, however, of disadvantage in the conventional piezoelectric resonator shown in FIG. 7 that the value of the resonance frequency is highly dependent on temperature. This basically results from a temperature dependence of the influence of the piezoelectric layer 11 on the value of the resonance frequency of the piezoelectric resonator. The so-called resonance frequency temperature coefficient of the material of which the piezoelectric layer 11 is formed is a measure of the influencing of the value of the resonance frequency of the piezoelectric resonator.

The acoustic densification layers 9a, 9b are characterized by a high acoustic impedance and provide for mechanical waves only to propagate to a small extent from the piezoelectric layer to other layers of the multi-layered setup shown here, in particular the electrodes 7a, 7b. At the same time, the acoustic densification layers 9a, 9b are formed of a material having a low resistivity, which is why they are characterized by a high electrical conductivity.

A number of methods are feasible for reducing the temperature dependence of the resonance frequency of the piezoelectric resonators. However, the only method which may be executed easily is depositing an amorphous silicon dioxide layer onto the piezoelectric layer 11 such that the multi-layered setup arranged between the two electrodes 7a, 7b comprises, among other things, the piezoelectric layer 11 and the amorphous silicon dioxide layer.

The amorphous silicon dioxide has a positive resonance frequency temperature coefficient, whereas materials from which the piezoelectric layer 11 is formed, preferably comprise a negative resonance frequency temperature coefficient. In order to obtain a marked improvement in the temperature dependence of the resonance frequency, it is necessary to arrange the layer of the amorphous silicon dioxide, which is also referred to as compensation or temperature compensation layer, between one of the two electrodes 7a, 7b and the piezoelectric layer 11, and preferably between one of the two acoustic densification layers 9a, 9b and the piezoelectric layer 11. In this region between one of the two electrodes 7a, 7b and the piezoelectric layer 11, the mechanical waves occurring when operating the piezoelectric resonator comprise a high amplitude.

This method of arranging an amorphous silicon dioxide layer between one of the two electrodes 7a, 7b and the piezoelectric layer 11 is suitable for compensating the temperature dependence of the resonance frequency, it entails, however, a reduction in the value of the electromechanical coupling coefficient $K_{eff}$, which results in the pass region of the piezoelectric resonator to become more narrow-banded. This has negative effects on the ways in which piezoelectric resonators may be utilized.

This reduction in the electromechanical coupling coefficients has two reasons. First, the electrical field forming in the amorphous silicon dioxide compensation layer results in a reduction of the electrical field in the piezoelectric layer 11 and thus in a deterioration of the electromechanical coupling.

The acoustic densification layers 9a, 9b, the piezoelectric layer 11 and the amorphous silicon dioxide layer are to be considered as a series connection of two resistors, wherein the voltage drop at the piezoelectric layer and the amorphous silicon dioxide layer depends on the conductivity of the respective layer. Since the acoustic densification layers 9a, 9b are characterized by a high electric conductivity, they do not influence the behavior of the series connection and the voltage drops at the piezoelectric layer 11 and the amorphous silicon dioxide layer.

In a piezoelectric resonator where only the piezoelectric layer 11 is arranged between the two electrodes 7a, 7b, the entire voltage drop would thus be at the piezoelectric layer 11, by which the electrical field forming therein would be greater than the electrical field forming in the piezoelectric resonator where the amorphous silicon dioxide layer is additionally arranged between one of the two electrodes 7a, 7b and the piezoelectric layer 11.

The amorphous silicon dioxide is characterized by a high resistivity, resulting in the amorphous silicon dioxide layer to be characterized by a poor electrical conductivity. This results in a considerable portion of the voltage between the two electrodes 7a, 7b to drop at the amorphous silicon dioxide layer in the series connection of the acoustic densification layers 9a, 9b, the amorphous silicon dioxide layer and the piezoelectric layer 11. This results in a decrease in the voltage drop at the piezoelectric layer 11 and thus in a reduction in the electrical field in the piezoelectric layer 11. This decrease in the electrical field in the piezoelectric layer 11 in turn causes a reduction of the electromechanical coupling coefficient of the piezoelectric resonator.

Apart from that, the amorphous silicon dioxide layer acting as the compensation layer for the temperature dependence of the resonance frequency comprises a relatively small acoustic resistance, which makes its usage in cooperating with the piezoelectric layer 11 and the electrode material in the piezoelectric resonator more difficult.

A reduction in the electromechanical coupling coefficient $k_{eff}$ cannot be tolerated in many applications of the piezoelectric resonator when same is preferably embodied as a bulk acoustic wave resonator. This condition makes a usage of the amorphous silicon dioxide layer for compensating the temperature dependence of the resonance frequency in the piezoelectric resonator more difficult.

There is, for example, the requirement to bulk acoustic wave resonators in mobile telephones that the electromechanical coupling coefficient be above a critical value of 0.9.

DE 100 45 090 A1 shows an acoustic resonator having a first electrode and a second electrode and a piezoelectric resonator arranged therebetween. In the acoustic resonator, there is an acoustic densification layer between the piezoelectric layer and the first electrode, the acoustic densification layer comprising a higher acoustic impedance than the first electrode.

U.S. Pat. No. 4,456,850 shows a piezoelectric thin-film resonator where a thin film of silicon dioxide having a resonance frequency temperature coefficient of a sign opposite to a resonance frequency temperature coefficient of a piezoelectric material is inserted between two thin films of the piezoelectric material. This multi-layered setup is arranged between two electrode films and deposited onto a substrate.

In the documents Applied Physics Letters, vol. 74, no. 20 of May 17$^{th}$, 1999, article "Eigenschaften von Aluminiumnitrid-Dünnfilmen für piezoelektrische Wandler und Mikrowellen-Filter-Anwendungen", thin-film bulk acoustic resonators having a resonance frequency temperature coefficient of approximately zero are discussed. In the studies mentioned there, it is explained that the positive resonance frequency temperature coefficient of an $SiO_2$ layer has a stabilizing effect on the resonance frequency since it compensates the negative resonance frequency temperature coefficient of a piezoelectric layer made of AlN.

SUMMARY OF THE INVENTION

Thus, it is an object of the present invention to provide a piezoelectric resonator having temperature compensation, which comprises an improved electromechanical coupling coefficient and is cheaper to manufacture.

In accordance with a first aspect, the present invention provides a piezoelectric resonator having a piezoelectric layer having a first resonance frequency temperature coefficient of a first sign, a first and a second electrode, wherein the piezoelectric layer is arranged between the first and second electrodes, and a compensation layer arranged between the first electrode and the piezoelectric layer, having a compensation material having a second resonance frequency temperature coefficient of a second sign opposite to the first one, wherein the compensation material is provided with a modification material to increase a conductivity of the compensation layer in a direction between the first electrode and the piezoelectric layer.

In accordance with a second aspect, the present invention provides a method for manufacturing a piezoelectric resonator, having a step of producing an arrangement of a piezoelectric layer having a resonance frequency temperature coefficient of a first sign, a first and a second electrode, wherein the piezoelectric layer is arranged between the first and second electrodes, and a compensation layer arranged between the first electrode and the piezoelectric layer, having a compensation material having a second resonance frequency temperature coefficient of a second sign opposite to the first one, wherein the step of producing is performed such that the compensation material is provided with a modification material to increase a conductivity of the compensation layer in a direction between the first electrode and the piezoelectric layer.

The present invention is based on the finding that a compensation material may be provided with a modification material in a compensation layer in a piezoelectric resonator such that a conductivity of the compensation layer is increased in a direction between an electrode and a piezoelectric layer, without concealing the desired acoustic characteristics of the compensation material by the modification material. When applying an electrical voltage to the electrodes of the piezoelectric resonator, an electrical field forms in the compensation layer and in the piezoelectric layer. The electrical field in the compensation layer is reduced by the fact that the compensation material is provided with the modification material so that the conductivity of the compensation layer is increased, which is how at the same time the electrical field forming in the piezoelectric layer is increased. This increase in the electrical field in the piezoelectric layer results in an increase in the electromechanical coupling coefficient of the piezoelectric resonator.

In one embodiment of the present invention, a value of the electromechanical coupling coefficient may be increased by inserting a modification material in the compensation layer for compensating the temperature dependence of the resonance frequency of the piezoelectric resonator. This increases the electrical field in the piezoelectric layer forming when applying an electrical voltage to the electrodes of the piezoelectric resonator, which is how the electromechanical coupling coefficient is increased. This increase in the electromechanical coupling coefficient goes hand in hand with an improvement of the filter characteristics of the piezoelectric resonator.

At the same time, the inventive provision of the compensation material with the modification material results in a higher manufacturing yield when mass-producing the piezoelectric resonator according to an embodiment of the present invention. The statistical mean value of the electromechanical coupling coefficient of the piezoelectric resonator according to an embodiment of the present invention manufactured in mass-production is increased by providing the compensation material with the modification material. This increase in the statistical mean value goes hand in hand with an increase in manufacturing tolerances, which causes a greater portion of the piezoelectric resonator according to an embodiment of the present invention manufactured in mass-production to have, in a final test when manufacturing, an electromechanical coupling coefficient which is above a specified value above which the piezoelectric resonator may be employed in an electrical device.

At the same time, the costs for manufacturing the piezoelectric resonators according to an embodiment of the present invention may be decreased due to the increased manufacturing yield.

At the same time, the inventive provision of the compensation material with a modification material for increasing the conductivity of the compensation layer results in more flexible variations of embodying the piezoelectric resonator according to an embodiment of the present invention. Since the negative effects of the silicon dioxide layer, which is typically employed as a compensation layer, on the electrical field in the piezoelectric layer are reduced, piezoelectric resonators according to an embodiment of the present invention may simultaneously be manufactured having a thicker amorphous silicon dioxide layer.

BRIEF DESCRIPTION OF THE DRAWINGS

Preferred embodiments of the present invention will be detailed subsequently referring to the appended drawings, in which.

DESCRIPTION OF PREFERRED EMBODIMENTS

Figure 7:
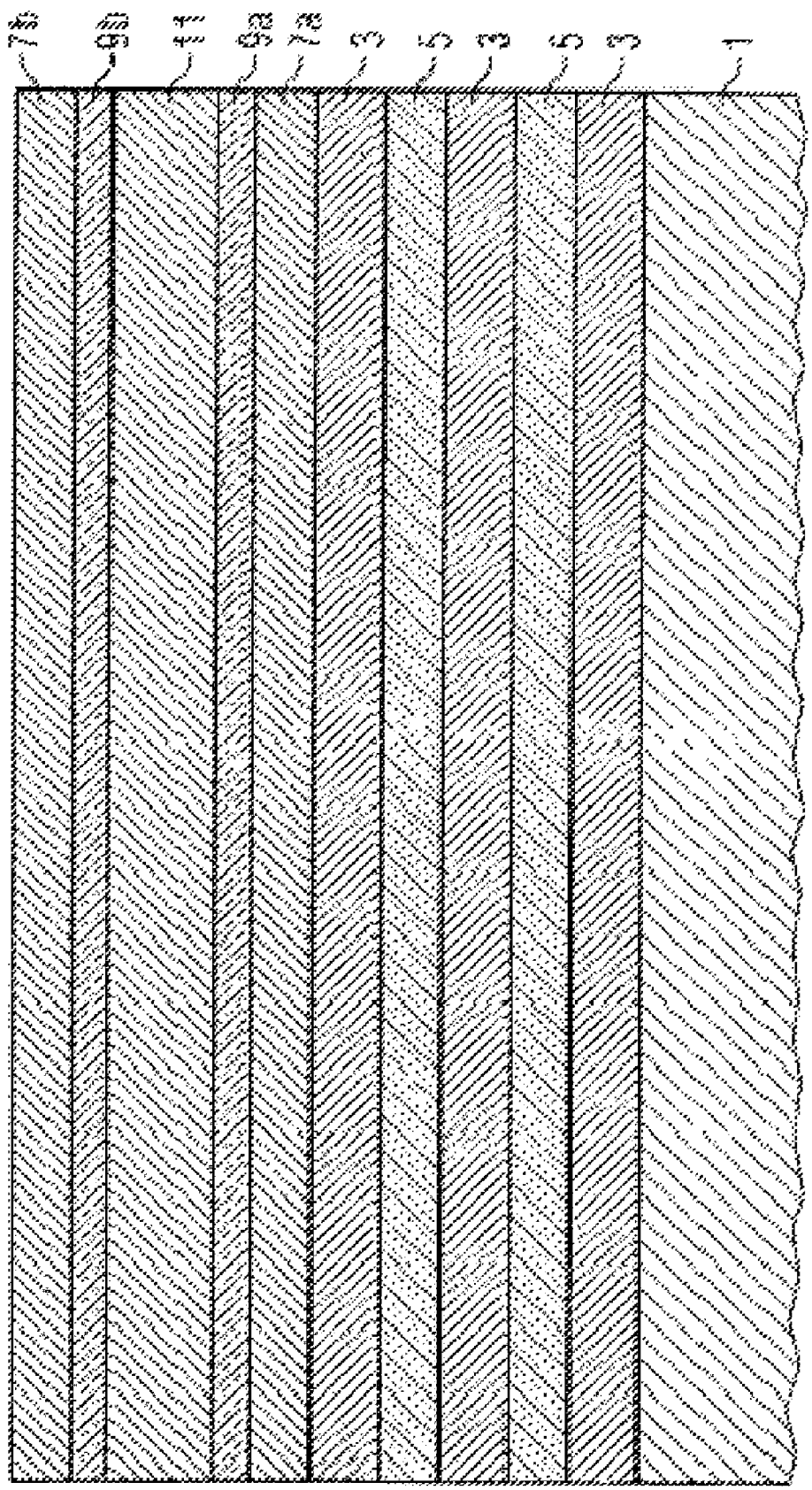
FIG. 7 shows a multi-layered setup of the conventional piezoelectric resonator.

In the following description of preferred embodiments same elements or elements having same effects will be referred to by the same reference numerals. In particular, elements being equal to or having the same effect as those of FIG. 7 are provided with the same reference numerals and the following description is limited to illustrating the differences to the setup according to FIG. 7.

Figure 1:
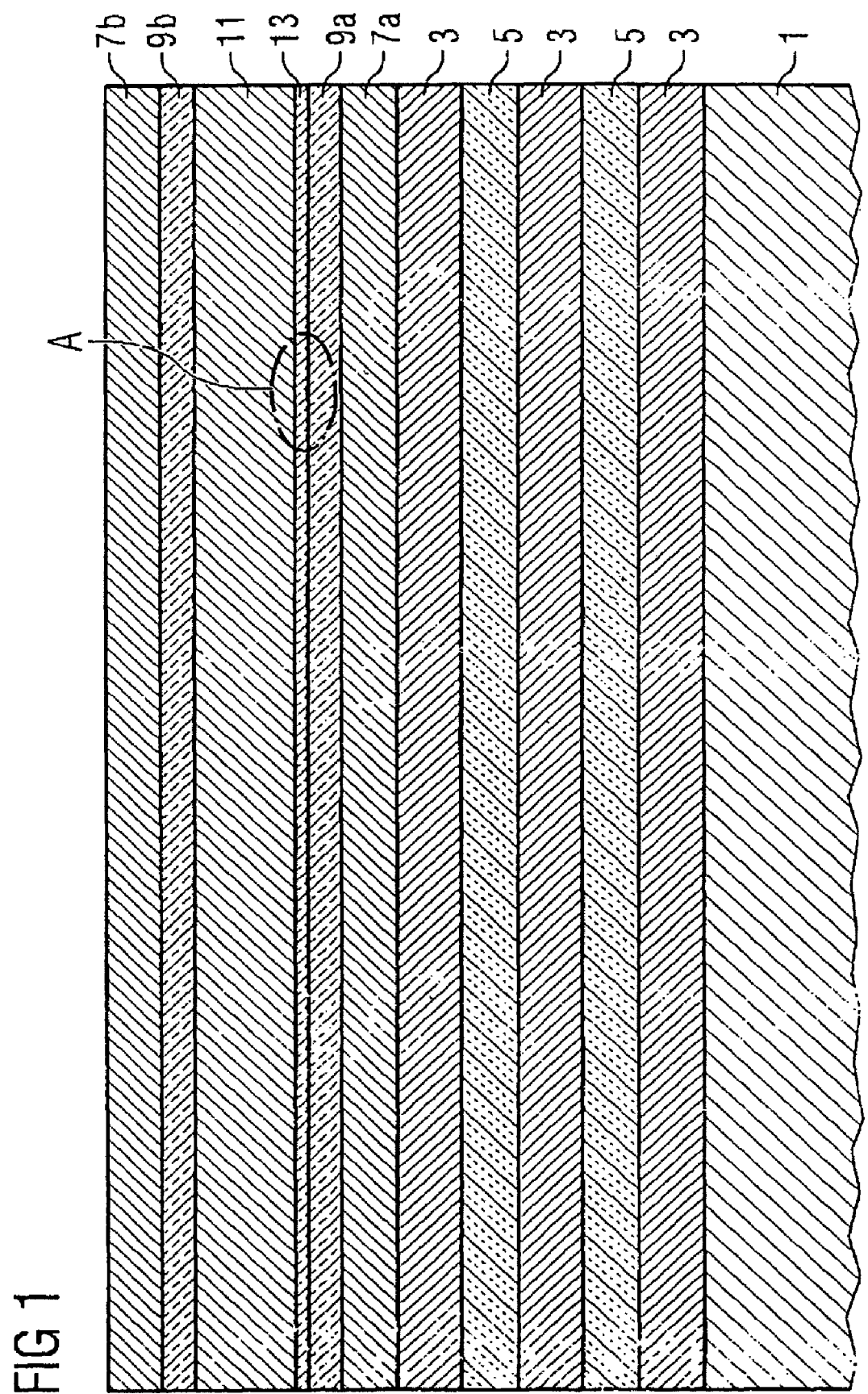
FIG. 1 shows a general setup of a piezoelectric resonator according to a first to third embodiment of the present invention.

FIG. 1 shows a general setup of a piezoelectric resonator according to the first to third embodiments of the present invention. This piezoelectric resonator according to the first to third embodiments of the present invention differs from the conventional piezoelectric resonator shown in FIG. 7 in that on the first acoustic densification layer 9a there is a compensation layer 13 onto which in turn the piezoelectric layer 11 is arranged.

The functionality of the compensation layer 13 and embodiments thereof will be explained in greater detail in the following embodiments illustrated in FIGS. 2 to 5.

Figure 2:
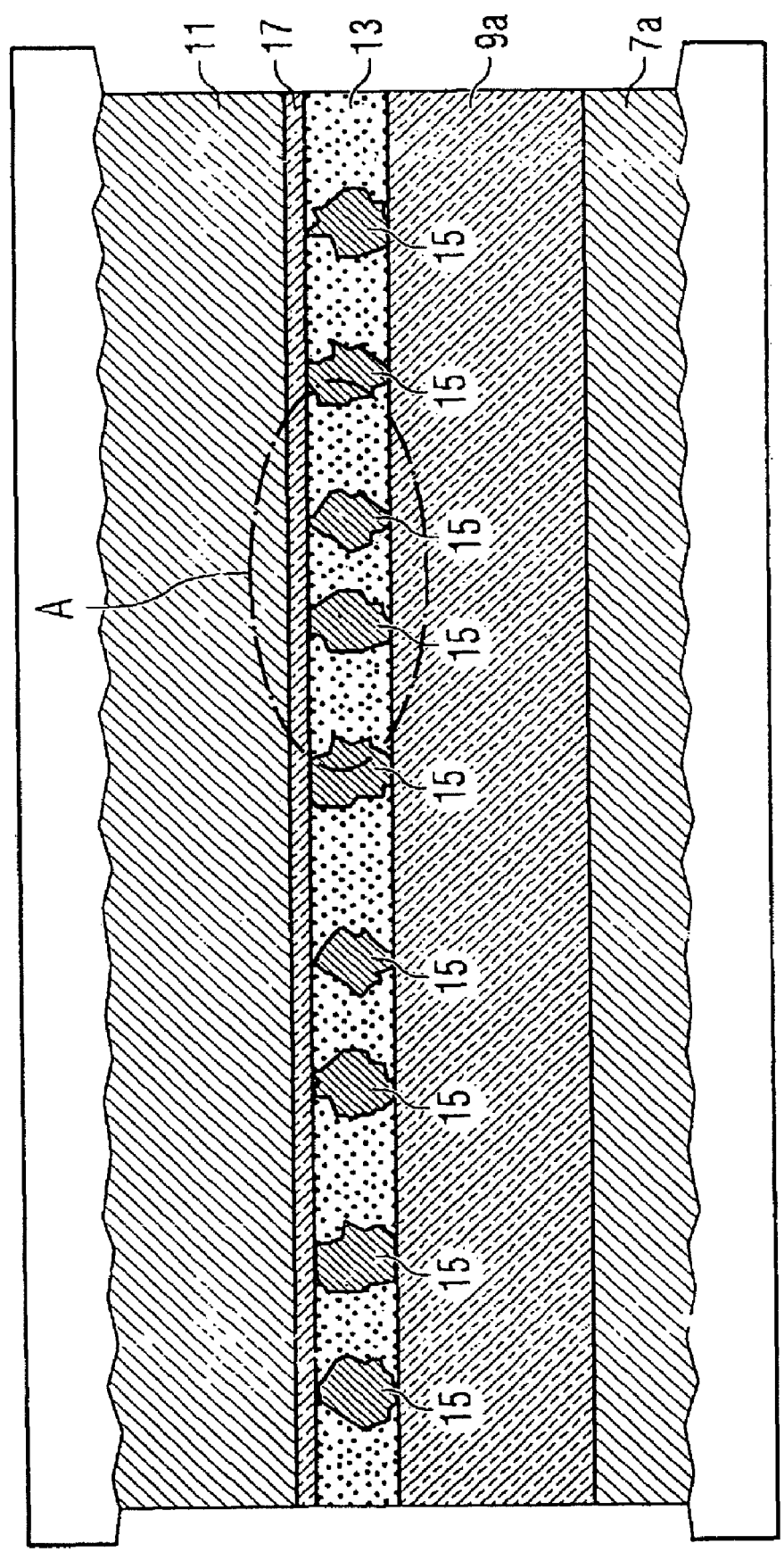
FIG. 2 shows a setup of a compensation layer having metallic nanoparticles in a piezoelectric resonator according to the first embodiment of the present invention.

FIG. 2 shows a first embodiment of the compensation layer 13 in a piezoelectric resonator according to the first embodiment of the present invention. Metallic nanoparticles 15 are introduced into the compensation layer 13, the metallic nanoparticles 15 extending in their dimensions from the first acoustic densification layer 9a to a cover layer 17 deposited onto the compensation layer 13. The cover layer 17 is made of a conductive material, preferably a metal. The piezoelectric layer 11 is deposited onto the cover layer 17. Section A explains how the layers shown in FIG. 2 are arranged in the multi-layered setup shown in FIG. 1.

When applying an electrical voltage to the electrodes 7a, 7b not shown in FIG. 2, an electrical field forms between the electrodes 7a, 7b. Since the layers arranged between the electrodes 7a, 7b represent a series connection of resistors, a voltage drop at the respective layer depends on the electrical conductivity of the layer. A value of the electrical field strength in the layers of the multi-layered setup thus also depends on the conductivity of the respective layer.

As has already been explained, the electrodes 7a, 7b, the cover layer 17 and the acoustic densification layers 9a, 9b are made from a conductive material such that no electrical field forms within. Only the compensation layer 13 and the piezoelectric layer 11 are manufactured from an insulating material. Here, the electrical field strengths in the insulating layers influence each other such that when there is a high electrical field strength in the compensation layer 13, there is a low electrical field strength in the piezoelectric layer 11 or when there is a low electrical field strength in the compensation layer 13, there is a high electrical field strength in the piezoelectric layer 11.

By introducing the metallic nanoparticles 15 into the compensation layer 13, the conductivity of the compensation layer 13 is increased in a direction between the first electrode 7a and the piezoelectric layer 11, which thus results in a reduction in the electrical field strength in the compensation layer 13 in a direction between the first electrode 7a and the piezoelectric layer 11. The decrease in the electrical field strength in the compensation layer 13 has the result that the electrical field strength in the piezoelectric layer 11 increases, which at the same time results in an increase in the electromechanical coupling coefficient of the piezoelectric resonator according to the first embodiment of the present invention illustrated here. Thus, the largest portion of the electrical field between the first electrode 7a and the second electrode 7b is concentrated on the piezoelectric layer 11.

The cover layer 17 arranged between the compensation layer 13 and the piezoelectric layer 11 serves to make the electrical field in the compensation layer 13 including both regions of amorphous silicon dioxide and also the metallic nanoparticles 15 introduced, more homogenous in its vertical distribution, that is in the direction perpendicular to the direction between the two electrodes 7a, 7b.

Metal threads or wires made of metallic materials may, however, also be introduced instead of the metallic nanoparticles 15.

Apart from introducing metallic nanoparticles 15 into the compensation layer 13, suitable doping atoms which may also increase the conductivity of the compensation layer 13 may also be introduced into the compensation layer 13.

By providing the compensation material of the compensation layer 13 with a modification material, the conductivity of the compensation layer 13 is increased in the direction between the first electrode 7a and the piezoelectric layer 11 or an electrical field in the compensation layer 13 is reduced in the direction between the first electrode 7a and the piezoelectric layer 11 when applying an electrical voltage to the electrodes 7a, 7b.

Figure 3:
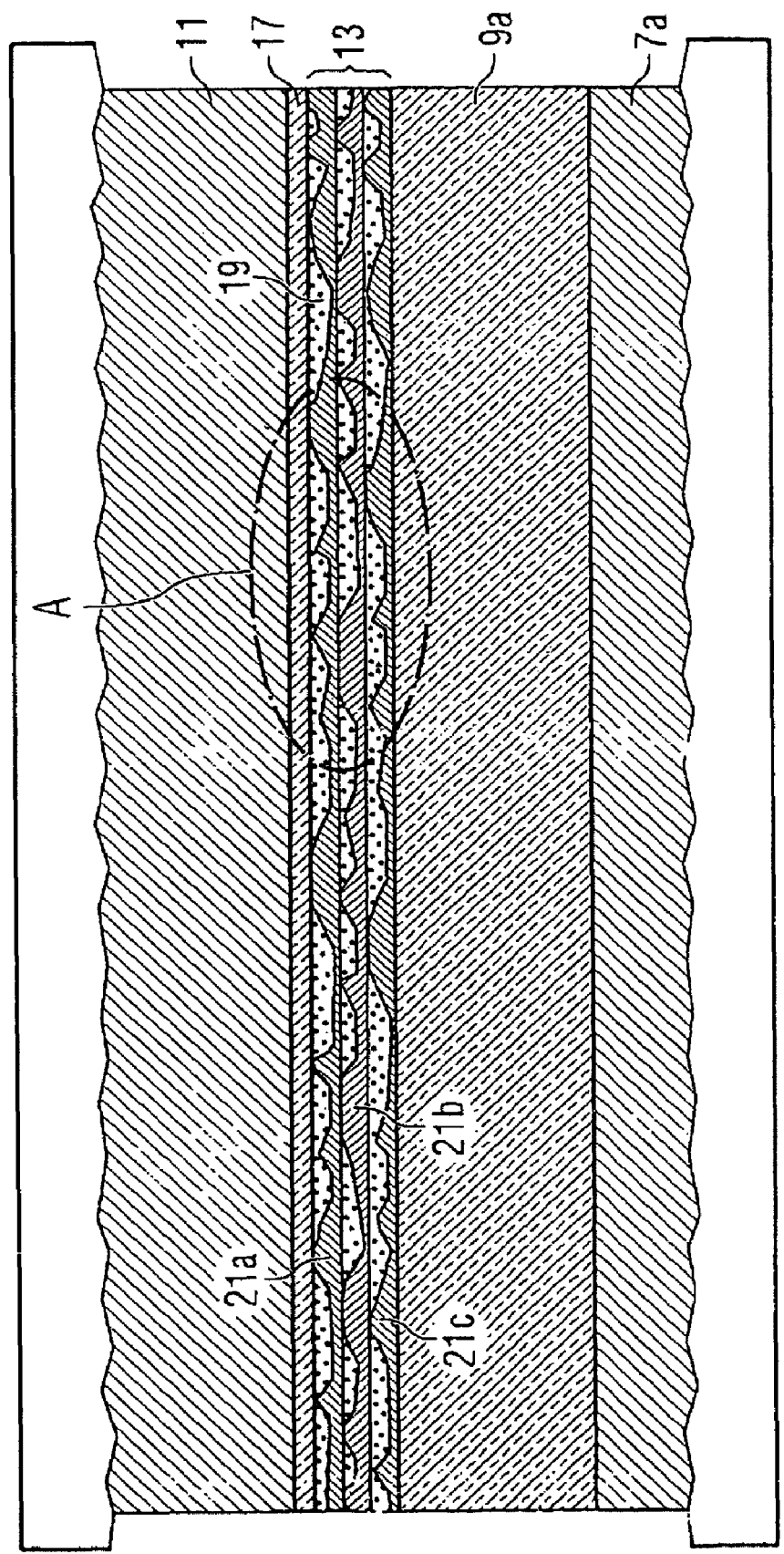
FIG. 3 shows a setup of a compensation layer consisting of a multi-layered setup of metal thin films between which silicon dioxide grains are arranged, in a piezoelectric resonator according to the second embodiment of the present invention.

FIG. 3 shows another embodiment of the compensation layer 13 in a piezoelectric resonator according to the second embodiment of the present invention. The compensation layer 13 here is formed from a first metal thin film 21a, a second metal thin film 21b and a third metal thin film 21c. Silicon dioxide grains 19 are introduced into the metal thin films 21a-c. Also, in the embodiment of the compensation layer 13 shown in FIG. 3, the acoustic behavior of the compensation layer 13 is decisively determined by the amorphous silicon dioxide grains 19, which in turn has the result that the compensation layer 13 counteracts a temperature dependence of the resonance frequency of the piezoelectric resonator produced by the piezoelectric layer 11.

At the same time, the conductivity of the compensation layer 13 is increased by arranging the silicon dioxide grains 19 between the metal thin films 21a-c and by arranging the metal thin films 21a-c on top of one another such that they are electrically connected to one another. This in turn has the result that, like in the embodiment shown in FIG. 2, the electrical field strength in the compensation layer 13 is reduced when applying an electrical voltage between the electrodes 7a, 7b, which is how the electrical field strength in the piezoelectric layer 11 is increased.

This, in turn, causes an increase in the electromechanical coupling coefficient of the piezoelectric resonator according to the second embodiment of the present invention.

Figure 4:
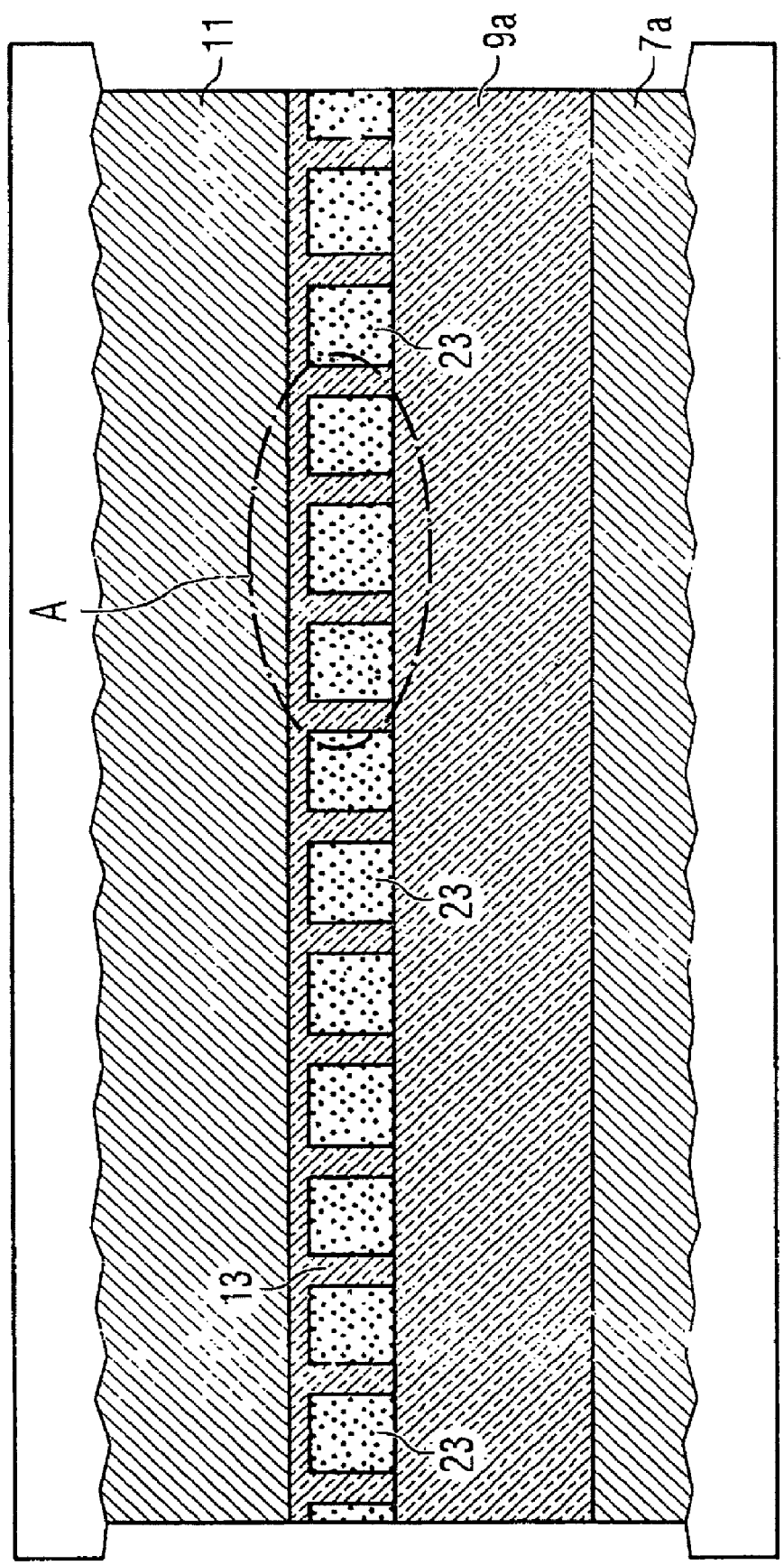
FIG. 4 shows a structure of a compensation layer in a piezoelectric resonator according to the third embodiment of the present invention, comprising recesses filled with metals.

FIG. 4 shows another embodiment of the compensation layer 13 in a piezoelectric resonator according to the third embodiment of the present invention. In the compensation layer 13, holes or recesses 23 extending in a vertical direction from the first acoustic densification layer 9a to the piezoelectric layer 11 are introduced into the compensation layer 13. The recesses 23 here are filled by a metal, which in turn increases the conductivity of the compensation layer 13. When applying a voltage between the electrodes 7a, 7b, this results in the effects on the field strength in the piezoelectric layer 11 and thus on the electromechanical coupling coefficient of the piezoelectric resonator according to the third embodiment of the present invention, which has already been illustrated in the previous embodiments of the compensation layer 13.

Figure 5:
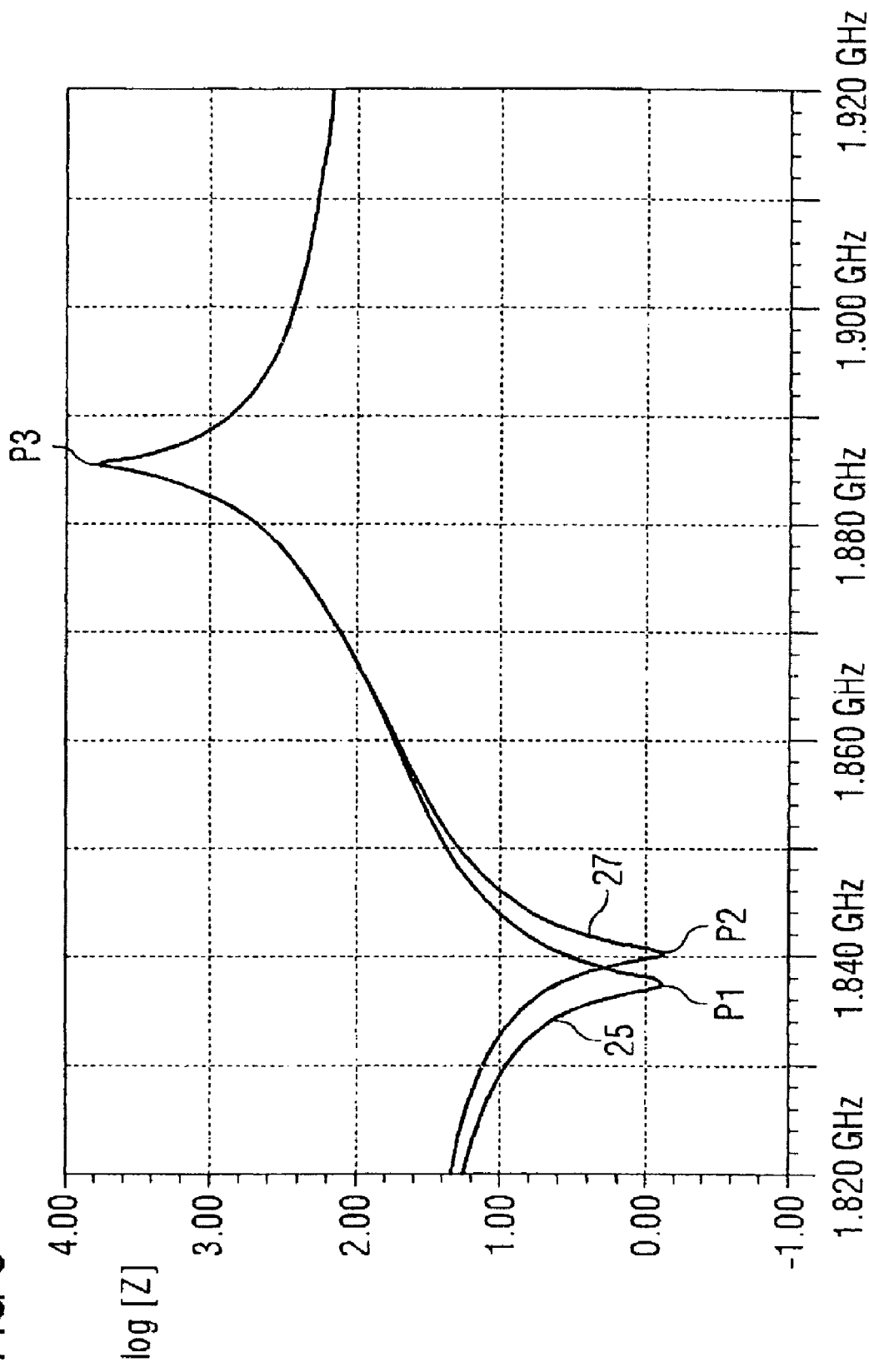
FIG. 5 shows a frequency response of a piezoelectric resonator according to the first embodiment of the present invention compared to a conventional piezoelectric resonator.

FIG. 5 shows a frequency response of the piezoelectric resonator according to the first embodiment of the present invention, which is discussed in FIG. 2, compared to a frequency response of the conventional resonator. The frequency is plotted on the x axis in a linear scale in a section of the frequency band between 1.82 GHz and 1.92 GHz, whereas the impedance of the resonator is plotted on the y axis in a logarithmic scale. A frequency response 25 of the piezoelectric resonator according to the first embodiment of the present invention differs from a frequency response 27 of the conventional resonator in that an impedance minimum P1 of the piezoelectric resonator according to the first embodiment of the present invention is at smaller a frequency value than an impedance minimum P2 of the conventional resonator. An impedance maximum P3 here is at the same frequency value in both the resonator according to the first embodiment of the present invention and in the conventional resonator.

It becomes obvious from a comparison of the frequency responses 25, 27 measured that, in the resonator according to the first embodiment of the present invention, a distance between the frequency value of the impedance minimum P1 and the impedance maximum P3 is greater than in the conventional resonator where the impedance minimum P2 is at higher a frequency value. As is known from literature, such as, for example, from the article already mentioned from Applied Physics Letters, vol. 74, no. 20 of May 17$^{th}$, 1999, which has already been cited in the description of the prior art, a square of the electromechanical coupling coefficient, frequently referred to as $K_{eff}^2$, is directly proportional to a difference of the frequency values where the impedance minimum and impedance maximum of a piezoelectric resonator occur. Thus, it becomes obvious that the result of the measurements is that the piezoelectric resonator according to the first embodiment of the present invention comprises a higher electromechanical coupling coefficient compared to the conventional piezoelectric resonator.

In the piezoelectric resonator according to the first embodiment of the present invention, the conductivity of the compensation layer 13 has been increased by introducing the metallic nanoparticles 15 in the direction between the first electrode 7a and the piezoelectric layer 11, which is how the parasitic electrical field in the compensation layer 13 forming when applying the voltage between the two electrodes 7a, 7b is reduced. It is, however, of advantage that this has no effects on the compensation of the temperature dependence of the piezoelectric resonator since it only depends on the acoustic characteristics of the compensation layer 13 which is still essentially influenced by the amorphous silicon dioxide in the compensation layer 13.

Analog effects result also for the frequency responses of the piezoelectric resonators according to the second and third embodiments of the present invention discussed in FIG. 3 and FIG. 4. Here, too, providing the compensation material in the compensation layer 13 with a modification material for increasing the electrical conductivity results in an increase in the distance between the frequencies where the impedance minimum P1 and the impedance maximum P3 occur, compared to the conventional piezoelectric resonator.

Thus, it is also possible to apply at least partial or complete temperature compensation to another spectrum of piezoelectric resonators, other than is possible in conventional piezoelectric resonators, since the increase in conductivity of the compensation layer 13 counteracts the reduction of the electromechanical coupling coefficient due to an increasing layer thickness of the compensation layer 13.

Consequently, piezoelectric resonators according to the first embodiment which is discussed in FIG. 2 may be manufactured having thicker compensation layers 13 than is positive in conventional piezoelectric resonators, because the negative impact of the higher layer thickness of the compensation layer 13 on its conductivity and thus on the electromechanical coupling coefficient is reduced by introducing the metallic nanoparticles 15.

Since the compensation layer 13 in conventional piezoelectric resonators is formed as an insulating layer or a dielectric layer, the methods of increasing the conductivity of the compensation layer 13 mentioned in the embodiments of the present invention may also be referred to as artificial increase in the conductivity or as artificial conductivity. Since the compensation layer 13 in the conventional piezoelectric resonators is typically very thin, a minor increase in the conductivity of the compensation layer 13 is often sufficient to improve the electromechanical coupling coefficient of the piezoelectric resonator in a desired way.

It is decisive when increasing the conductivity of the compensation layer 13 that this takes place in a vertical direction, that is in the direction between the electrodes 7a, 7b in the multi-layered setup of the piezoelectric resonator shown in FIG. 1.

Figure 6:
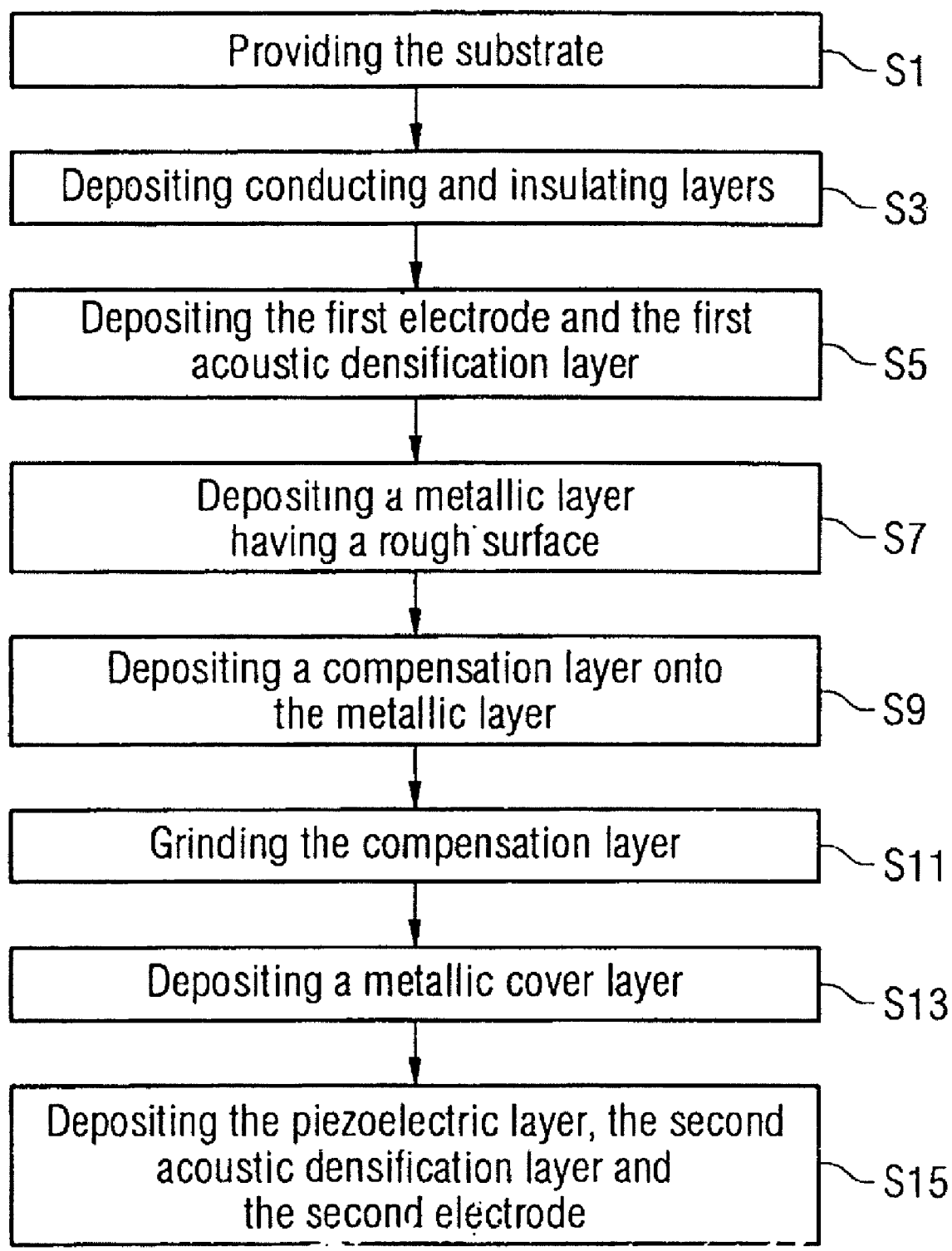
FIG. 6 shows a method for manufacturing a piezoelectric resonator according to a fourth embodiment of the present invention.

FIG. 6 discusses a method for manufacturing the piezoelectric resonator according to a fourth embodiment of the present invention. At first, the substrate 1 of the piezoelectric resonator is provided in a step S1. Subsequently, the conducting layers 3 and the insulating layers 5 are deposited alternatingly in a step S3. After that, the first electrode 7a is deposited onto the uppermost conducting layer 3 in a step S5. Subsequently, the first electrode 7a is covered by the first acoustic densification layer 9a in the same method step.

In a subsequent step S7, a metallic layer having a rough surface is deposited onto the first acoustic densification layer 9a. Subsequently, the compensation layer 13 is deposited onto the metallic layer having a rough surface in a method step S9 that it is arranged on the surface of the metallic layer having a rough surface facing away from the first acoustic densification layer 9a. After that, the compensation layer 13 is ground in a step S1, wherein the compensation layer 13 is ground until elevations of the rough surface of the metallic layer are reached, these also being abraded partially. When inspecting the surface of the abraded compensation layer 13, area regions having been formed by abrading the elevations of the rough surface of the metallic layer may be recognized. Subsequently, the metallic cover layer 17 is deposited onto the surface of the compensation layer 13 facing away from the metallic layer in a step S13. The piezoelectric layer 11, the second acoustic densification layer 9b and the second electrode 7b are deposited onto the metallic cover layer 17 one after the other in a final method step S15.

Depositing the compensation layer 13 onto the metallic layer having a rough surface and subsequently grinding the compensation layer 13 in step S11 results in the conductivity of the compensation layer 13 to be increased by the elevations of the surface of the metallic layer having a rough surface formed throughout the compensation layer 13. Depositing the cover layer 17 having a conducting material in step S13, in the manufacturing method for the piezoelectric resonator according to the fourth embodiment of the present invention serves to make the electrical field in the compensation layer 13 more homogenous when applying an electrical voltage between the first electrode 7a and the second electrode 7b.

In the above embodiments, the compensation layer 13 is ground in the manufacturing method for the piezoelectric resonator according to an embodiment of the present invention. Any forms of abrading the compensation layer 13, such as, for example, polishing, preferably even chemical-mechanical polishing or even etching processes, are alternatives.

In the manufacturing method illustrated in FIG. 6, the metallic layer having a rough surface is deposited in step S7. Alternative for the metallic layer are layers made of any materials which are conducting and comprise rough surfaces. The same also applies to the metallic cover layer 17 deposited in step S13, which may also be formed from any conductive material.

The metallic nanoparticles 15 shown in FIG. 2 may alternatively also include any conducting material.

It is discussed in the above embodiments of the present invention that the multi-layered setup is arranged between the electrodes 7a, 7b on the three conducting layers 3 and the two insulating layers 5. The conducting layers 3 and the insulating layers 5 may alternatively, however, also be omitted or an arbitrary number of electrical and insulating layers may be arranged in the piezoelectric resonator between the first electrode 7a and the substrate 1.

In the above embodiments, the compensation layer 13 is formed from an amorphous silicon dioxide. Alternatives are any materials comprising a resonance frequency temperature coefficient having an opposite sign to the resonance frequency temperature coefficient of the piezoelectric layer 11. In the above embodiments, the acoustic densification layers 9a, 9b are electrically conducting, alternative for this, however, are electrically insulating acoustic densification layers.

In the above embodiments of the piezoelectric resonator, the piezoelectric layer 11 and the compensation layer 13 are arranged between the acoustic densification layers 9a, 9b. Any arrangements of layers between the electrodes 7a, 7b of the multi-layered setup of the embodiments of the present invention shown in FIG. 1 or introducing further layers into the layer sequence between the electrodes 7a, 7b, which is shown in FIG. 1, are alternatives.

Additionally, the acoustic densification layers 9a, 9b may also be omitted in the general setup shown in FIG. 1 of a piezoelectric resonator according to a first to third embodiments of the present invention. Furthermore, an arrangement where—alternatively or additionally—a compensation layer 13 is arranged between the upper electrode 9b, i. e. the second electrode 9b and the piezoelectric layer 11 might also be conceivable.

Also, the cover layer 17 could be arranged in an alternative way in the layer sequence between the electrodes 7a, 7b on the surface of the compensation layer 13 facing the first acoustic densification layer 9a, preferably when the acoustic densification layer is formed from an insulating material.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for manufacturing a piezoelectric resonator, the method comprising:
   producing an arrangement comprising a piezoelectric layer having a resonance frequency temperature coefficient of a first sign, a first and a second electrode, the piezoelectric layer being arranged between the first and second electrodes, and a compensation layer arranged between the first electrode and the piezoelectric layer, the compensation layer having a compensation material having a second resonance frequency temperature coefficient of a second sign opposite to the first sign, wherein the producing comprises:

providing the compensation material with a modification material to increase an electrical conductivity of the compensation layer in a direction between the first electrode and the piezoelectric layer.

2. The method according to claim 1, wherein the producing the arrangement comprises depositing the compensation layer on a conducting layer having a rough surface.

3. The method according to claim 2, wherein producing the arrangement comprises eroding the compensation layer after the step of depositing the compensation layer on the conducting layer.

4. The method according to claim 3, wherein the eroding the compensation layer is performed such that the compensation layer comprises a surface having a first area region facing away from the conducting layer, which has resulted from an eroded elevation in the rough surface of the conducting layer, and comprises a second area region which has resulted from the eroded compensation layer.

5. The method according to claim 2, wherein the producing the arrangement further comprises depositing a cover layer onto a surface of the compensation layer facing away from the conducting layer having a rough surface.

* * * * *